(12) United States Patent
Takatani

(10) Patent No.: US 8,969,973 B2
(45) Date of Patent: Mar. 3, 2015

(54) MULTI-GATE SEMICONDUCTOR DEVICES

(75) Inventor: Shinichiro Takatani, Tao Yuan Shien (TW)

(73) Assignee: Win Semiconductors Corp., Tao Yuan Shien (TW)

(*) Notice: Subject to any disclaimer, the term of this patent is extended or adjusted under 35 U.S.C. 154(b) by 380 days.

(21) Appl. No.: 12/803,717

(22) Filed: Jul. 2, 2010

(65) Prior Publication Data
US 2012/0001230 A1 Jan. 5, 2012

(51) Int. Cl.
| H01L 27/088 | (2006.01) |
| H01L 29/778 | (2006.01) |
| H01L 21/768 | (2006.01) |
| H01L 29/423 | (2006.01) |
| H01L 29/20 | (2006.01) |
| H01L 29/417 | (2006.01) |

(52) U.S. Cl.
CPC ...... *H01L 29/7785* (2013.01); *H01L 21/76895* (2013.01); *H01L 29/2003* (2013.01); *H01L 29/41758* (2013.01); *H01L 29/42316* (2013.01); *H01L 29/7786* (2013.01)
USPC .......................................................... 257/401

(58) Field of Classification Search
CPC ...................... H01L 29/41758; H01L 23/4824
USPC ........................................................... 257/401
See application file for complete search history.

(56) References Cited

U.S. PATENT DOCUMENTS

| 6,642,578 B1* | 11/2003 | Arnold et al. ................. 257/341 |
| 7,783,265 B2* | 8/2010 | Ogawa et al. .................. 455/83 |
| 7,982,243 B1* | 7/2011 | Iversen et al. ................ 257/202 |
| 2008/0230807 A1* | 9/2008 | Kuroda et al. ................ 257/197 |

* cited by examiner

*Primary Examiner* — William D Coleman
(74) *Attorney, Agent, or Firm* — Muncy, Geissler, Olds & Lowe, P.C.

(57) ABSTRACT

A multi-gate semiconductor device with inter-gate conductive regions being connected to balance resistors is provided. The multi-gate semiconductor device comprises a substrate, a multilayer structure formed upon the substrate, a first ohmic electrode, a second ohmic electrode, a plural of gate electrodes, at least one conductive region, and at least one resistive component. When put into practice, the multi-gate semiconductor device is advantageous in reducing the voltage drop along the conductive region with a minimal change in device layout, improving the OFF-state linearity while retaining a low insertion loss, and minimizing the area occupied by the resistor and hence the total chip size.

6 Claims, 14 Drawing Sheets
(1 of 14 Drawing Sheet(s) Filed in Color)

MULTI-GATE SEMICONDUCTOR DEVICES

BACKGROUND OF THE INVENTION

1. Field of the Invention

The present invention relates to a semiconductor field effect transistor, and more particularly to a switch element using a field effect transistor whose conduction and nonconduction are controlled.

2. Background of the Invention

Switch elements are commonly used in multipurpose integrated wireless circuits for switching the path of the RF signal between parts of the circuits. Antenna switch is a typical application of such RF switch elements, in which the switch connects an antenna with transmitting and receiving circuits. In order to prevent the loss of transmitted signal and its leakage into the receiving part, the antenna switches are required to have low insertion loss and high isolation in their ON and OFF states, respectively. Although a number of device types can provide such functionalities, the most commonly used devices for the antenna switch in monolithic microwave integrated circuits (MMIC's) are the multi-gate field effect transistors (FET), or in particular, the multi-gate pseudomorphic high-electron-mobility transistors (pHEMT).

An issue of concern in using multi-gate FETs as switch elements is the linearity of the switch operating in its OFF state. FIG. 1 depicts the cross section of a typical dual-gate FET structure, comprising, in general, a substrate 101, a buffer layer 102, a channel layer 103, a low conducting layer 104, a high conducting layer 105, two ohmic electrodes 106, and two of Schottky electrodes 107 disposed between the two ohmic electrodes 106. The two ohmic electrodes 106 contact ohmic-contacted to the channel layer 103 via the high conducting layer 105, functioning as the source and the drain terminals of the FET. The two Schottky electrodes 107, on the other hand, act as multi-gate electrodes of the FET, which contact to the low conducting layer 104 via recess etching. In the dual-gate FET device, there exists a conductive region 108 between the two adjacent gate electrodes 107. The conductive regions 108 only have minor effects when the dual-gate FET is operating in its ON state. However, when the dual-gate FET is operating in its OFF state, the channel is closed and the conductive region 108 between the two adjacent gates 107 becomes floating. At OFF state, the floating conductive region 108 will be biased at a voltage just below the threshold voltage of the channel irrespective of the magnitude of the reverse voltage applied between gate and ohmic electrodes. This induces the low operation margin of the FET in preventing a large input signal from leaking through the FET. At the same time, due to the large voltage dependence in the capacitance component near the threshold voltage, the large nonlinearity is induced in the FET at OFF-state, and thus would generate large distortion when the antenna switch handles high RF powers.

To improve the OFF-state linearity of a multi-gate FET, the inter-gate conductive regions must be electrically connected. However, the spacing between gates is usually narrower than the width of a resistor component or a contact wire. If the inter-gate spacing was increased substantially for connecting the conductive regions to a resistor, the ON-state resistance and hence the insertion loss of the antenna switch will increase. Therefore, the inter-gate spacing must be maintained as narrow as possible. To solve this problem, the conductive regions of a multi-gate FET are usually connected to a balance resistor at one end of the gate electrodes, where the inter-gate spacing is made wider in order to enable the formation of electrical contacts, as shown illustrated in FIGS. 2A and 2B.

By connecting to the balance resistor, the voltage of the conductive region between gates in the OFF state is fixed at a voltage close to source and drain, thereby improving the OFF-state linearity of the switch. However, as the inter-gate spacing is shrunk, the resistance of the conductive regions between two adjacent gates becomes larger. As a result, the voltage drop along the conductive region due to gate leakage current becomes appreciable, leading to OFF-state linearity degradation. The OFF-state linearity will be further degraded at higher operation temperatures, where the gate leakage current becomes even larger.

Therefore, there is a need to provide a new design for a multi-gate FET, of which the connection of the inter-gate conductive regions to a balance resistor, with improved OFF-state linearity while retaining a low insertion loss and a small total chip size.

SUMMARY OF THE INVENTION

It is an object of the present invention to provide a new design for connecting the inter-gate conductive regions of a multi-gate FET to a balance resistor, by which the voltage drop along the conductive region can be reduced, thereby improving the OFF-state linearity while retaining a low insertion loss and a small total chip size.

In order to achieve the abovementioned objects, the present invention provide a new design for multi-gate FET devices, of which the connection of the balance resistor to the inter-gate conductive regions is made at a point between the two ends of meanderingly wrapping gates, preferably near the middle of the meanderingly wrapping gates. The electrical connection between the balance resistor and the inter-gate conductive region is made at a turning region of the meanderingly wrapping gates. The balance resistor can be disposed along the periphery of FET area, preferably under the metal layer connecting the source and the drain electrodes, thereby minimize the area occupied by the resistor. The balance resistor can be preferably formed by a mesa-type resistor.

The advantages of the design of multi-gate FET devices for the applications in switch elements including:

1. Reducing the voltage drop along the conductive region with a minimal change in device layout;
2. Improving the OFF-state linearity while retaining a low insertion loss;
3. Minimizing the area occupied by the resistor and hence the total chip size.

The following detailed description, given by ways of examples or embodiments, will best be understood in conjunction with the accompanying drawings.

BRIEF DESCRIPTION OF DRAWINGS

The patent or application file contains at least one drawing executed in color. Copies of this patent or patent application publication with color drawing(s) will be provided by the Office upon request and payment of the necessary fee.

DETAILED DESCRIPTION OF PREFERRED EMBODIMENTS

Figure 1:
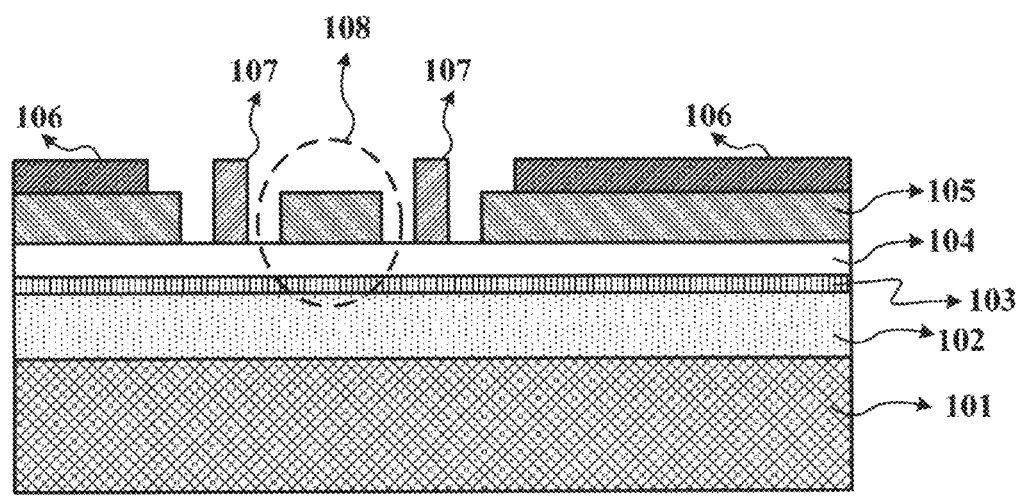
FIG. 1 is a schematic of the cross-sectional view of a multi-gate FET structure.
Figure 2A:
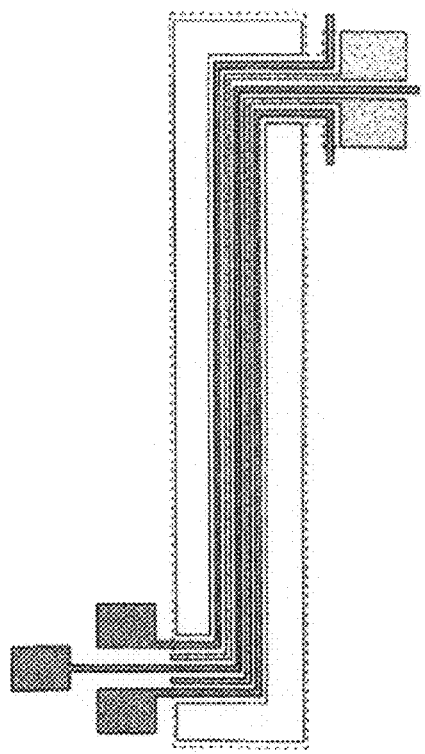
FIGS. 2A to 2B are device layout of a multi-gate FET of prior arts with a balance resistor connecting from the inter-gate conductive regions at one end of the gate electrode fingers to the source and drain electrodes.
Figure 2B:
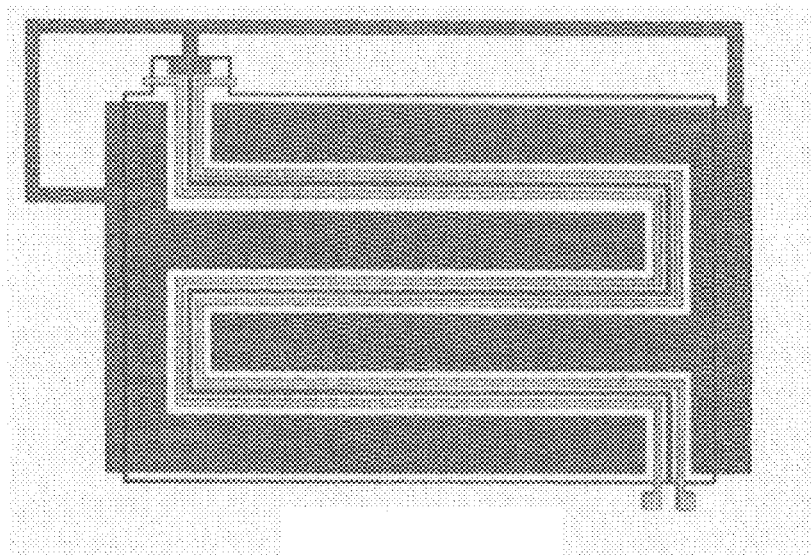
Figure 3:
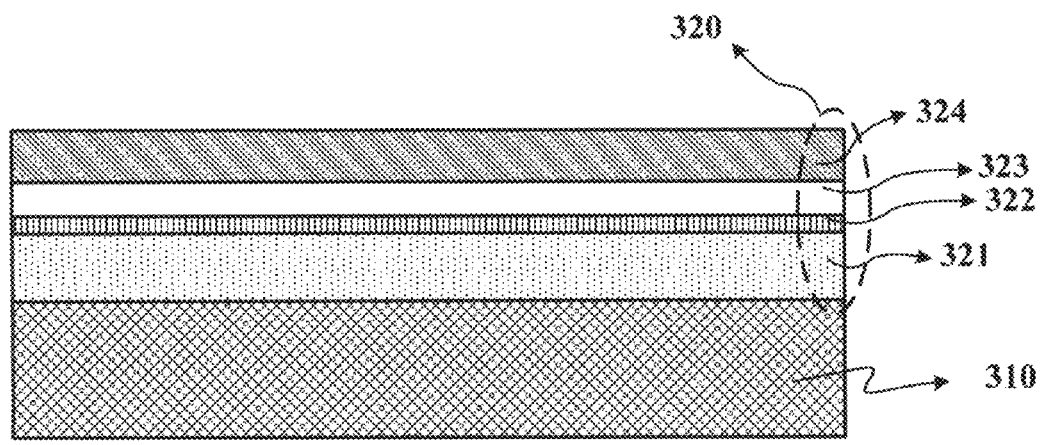
FIG. 3 is the epitaxial layer structure of an embodiment of the present invention.

FIG. 3 illustrates the epitaxial layer structure used for the invention. It is basically a multilayer structure formed on a substrate 310. The substrate is a semi-insulating substrate, preferably a semi-insulating GaAs substrate, or other substrates suitable for the epitaxial growth of a multilayer structure thereon. After providing the substrate 310, the multilayer structure 320 are then grown on the substrate 310 by well-known technologies, such as molecular beam epitaxy (MBE), or metalorganic chemical vapor deposition (MOCVD). The multilayer structure generally consists of a buffer layer 321, a channel layer 322, a low conducting layer 323 thereon, and a high conducting layer 324 thereon.

The multilayer structure 320 can be designed as a high-electron-mobility transistor (HEMT) structure, or a pseudomorphic HEMT (pHEMT) structure. Hereinafter, the multilayer structure of a pHEMT will be briefly described.

A typical pHEMT multilayer layer structure generally consists of a buffer layer consisting typically of AlGaAs layer or AlGaAs/GaAs multi-stacking layers, a bottom modulation doped AlGaAs layer containing a thin (about 10 nm) highly n-type doped layer, an undoped AlGaAs bottom spacer layer, a InGaAs channel layer with the thickness typically between 5 nm and 20 nm, an undoped AlGaAs top spacer layer, a top modulation doped AlGaAs layer containing a thin (about 10 nm) highly n-type doped layer, an undoped AlGaAs top barrier layer, and a heavily doped GaAs contact layer for source/drain ohmic contacts.

Another type of FET that is preferably used in the present invention is gallium nitride (GaN) FET. A typical GaN FET multilayer structure consists of a buffer layer, GaN layer and AlGaN layer that are formed sequentially on a substrate. A gate electrode is formed either by Schottky contact or by metal-insulator-semiconductor contact to the topmost AlGaN layer. Two source/drain ohmic electrodes are typically formed on the AlGaN layer at both side of the gate electrode, and are ohmic-connected to the conductive channel formed at or near the AlGaN/GaN interface.

After the epitaxial growth of the multilayer structure 320, the wafer can then be processed into multi-gate FET devices for switch applications. Hereinafter, a number of embodiments in accordance with the present invention will be described.

Figure 4A:
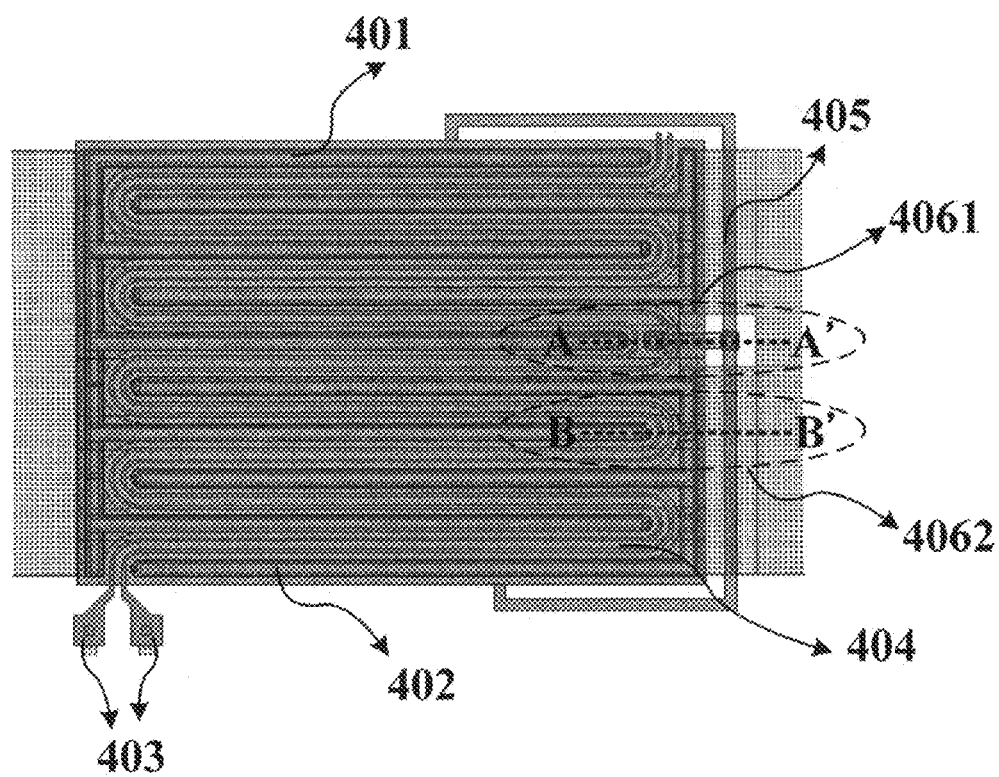
FIG. 4A is a schematic illustrating the device layout of a dual-gate FET of the present invention.
Figure 4B:
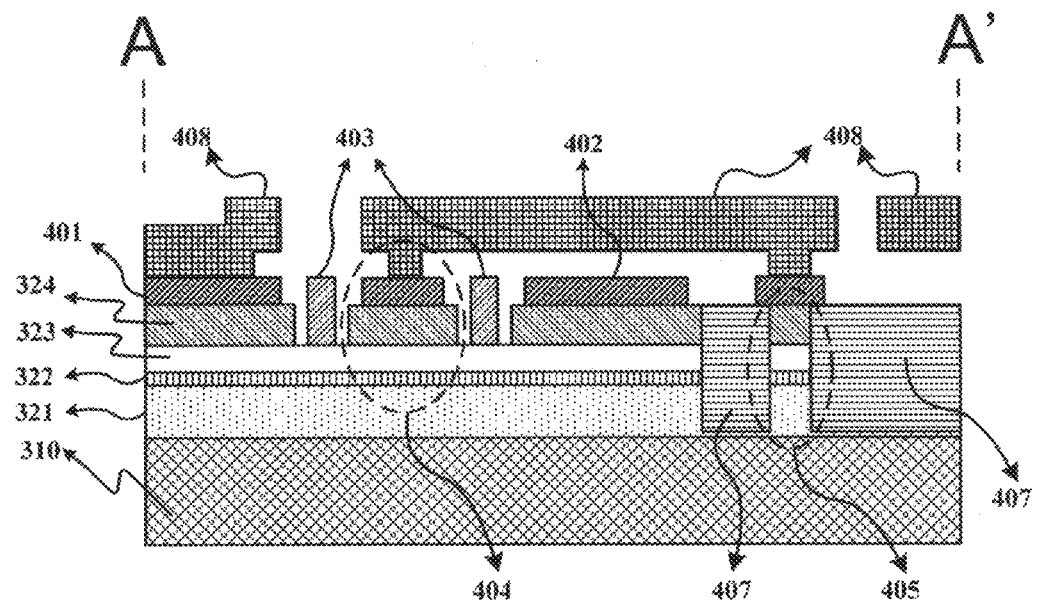
FIG. 4B is the cross-section structure along AA' line indicated in FIG. 4A near the turning region of the meanderingly wrapping gates with electrical connections to the resistive components.
Figure 4C:
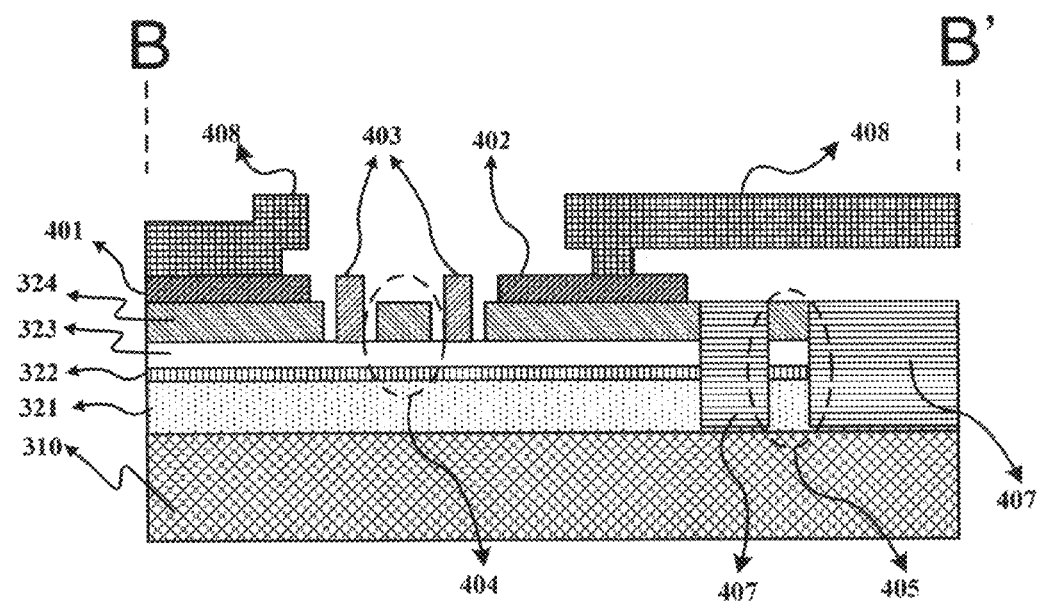
FIG. 4C is the cross-section structure along BB' line indicated in FIG. 4A, which locates also at a turning region of the meanderingly wrapping gates, but at which without electrical connections to the resistive components.

1. Dual-gate FET with One Contact to the Inter-gate Region:

In this embodiment, a dual-gate FET with one contact point connecting the inter-gate conductive region and the resistive components, in accordance with the present invention, will be described. FIG. 4A is a schematic illustrating the device layout of a dual-gate FET in accordance with the present invention. The dual-gate FET consists of two adjacent ohmic electrodes formed by a plural of electrode fingers as the source 401 and the drain electrode fingers 402, and two gate electrodes 403 being disposed between the source 401 and the drain electrode fingers 402, and is wrapping meanderingly around edges of the source/drain electrode fingers. The source 401 and the drain 402 electrode fingers contact directly to the high conducting layer 324, while the gate electrodes 403 are making a Schottky contact to the low conducting layer 323 via recess etching away the high conducting layer 324. Therefore, there exists an inter-gate conductive region 404 between the two adjacent gate electrodes 403. In order to achieve a better OFF-state linearity while retaining a low insertion loss, a resistive component 405 is connected to the inter-gate conductive region 404. The resistive component 405 can be made of a mesa-type semiconductor layer or a thin film resistor. In this embodiment, a mesa-type resistor is preferred. The electrical connection between the resistive component 405 and the inter-gate conductive region 404 is made at a turning region 4061 near the middle of the meanderingly wrapping gates. FIG. 4B shows a cross-section view near the turning region 4061 along the AA' line in FIG. 4A, which further elucidates how the electrical connection can be made between the inter-gate conductive region 404 and the resistive component 405. As shown in FIG. 4A, the resistive component 405 is formed by the multilayer structure itself, with a dimension defined by surrounding isolation regions 407. The isolation regions 407 can be fabricated by etching away the multilayer structure therein, or by ion implementation thereon, forming a mesa-type resistor that is electrically isolated from the multilayer structure of the FET device. Because the electrical connection between the inter-gate conductive region 404 and the resistive component 405 is intentionally disposed at the turning region 4061 of the meanderingly wrapping gates 403, where the two gate electrodes can be designed to have a wider inter-gate spacing, such that ohmic contact electrodes can be easily formed on the inter-gate conductive region 404 and on the resistive component 405 during the same fabrication process for the source 401 and the drain 402 electrode fingers. A wire metal layer 408 can then be fabricated to achieve electrical connections between the inter-gate conductive region 404 and the resistive component 405 at the turning region 4061. FIG. 4C shows a cross-section view along the BB' line indicated in FIG. 4A, which also locates at a turning region 4062, but without the electrical connection to resistive component 405. It can be clearly seen that the inter-gate spacing is narrower and no connection is made to the resistive component 405 under the wire metal layer 408. The resistive component 405 is further electrically connected to the outmost fingers of the source and drain electrode fingers, such that the voltage at the conductive region can be stabilized.

Although the gate-to-gate distance is made wider at the turning point to facilitate an ohmic contact electrode in between, the main body of FET along the source and drain fingers maintains its original gate-to-gate distance. Thus, impact on the device performance such as on resistance is minimized.

In addition, the balance resistor is placed along the periphery of the FET, thereby the area occupied by the resistor is also reduced. The balance resistor can also be placed under the wire metal layer, thereby keeping a good electrical connection of the wire metal to source and drain electrode.

The advantages of connecting the inter-gate conductive region to the balance resistor near the middle of the gate electrodes, rather than at one end of the gate electrodes as disclosed in prior arts, can be understood from the following simple estimations. Let's consider, for example, a triple-gate HEMT, with an inter-gate spacing of 1 µm and a gate width of 4 mm. The resistivity of the inter-gate conductive regions, which are made of a heavily doped GaAs cap layer and the channel layer underneath, is about $Rs=150\Omega/\square$, corresponding a total resistance of $R=600$ k$\Omega$ along the conductive region from one end to the other end. When the balance resistor is connected at the half way of meandering gate, the total resistance seen from the connecting point will be reduced by a factor of 2, i.e., $R=300$ k$\Omega$. This means that, for the same leakage current, the voltage drop can also be reduced by a factor of 2, as compared with that connecting the balance resistor at one end of the gate electrodes. In such a triple-gate device operating at a gate voltage of $Vg=2.5$ V, the leakage current is about 0.1 µA/mm at room temperature. However, when the operating temperature is increased to 85° C., the leakage current can be up to 1.3 µA/mm. Such a large leakage current will produce a large voltage drop, leading to a degraded device linearity. Connecting the balance resistor at the half way of meanderingly wrapping gate can halve the voltage drop, thereby preserving a good device linearity, particularly at higher operating temperatures.

It is noted that the resistance of the balance resistor is typically chosen between 10 k$\square$ and 20 k$\square$, which is much lower than the resistance of inter-gate conductive regions.

As elucidated above, it is clear that the contact point, between the inter-gate conductive region and the resistive components, is not necessary to be disposed at the middle of the gate electrodes. Furthermore, the number of contact point is also not limited to one; the use of a plural of contact points together with a plural of resistive components disposed at different positions along the gate electrodes is also feasible. Hereinafter, different combinations of the number of gate electrodes and contacts to balance resistors, which are also possible embodiments of the present inventions, will be described.

Figure 5:
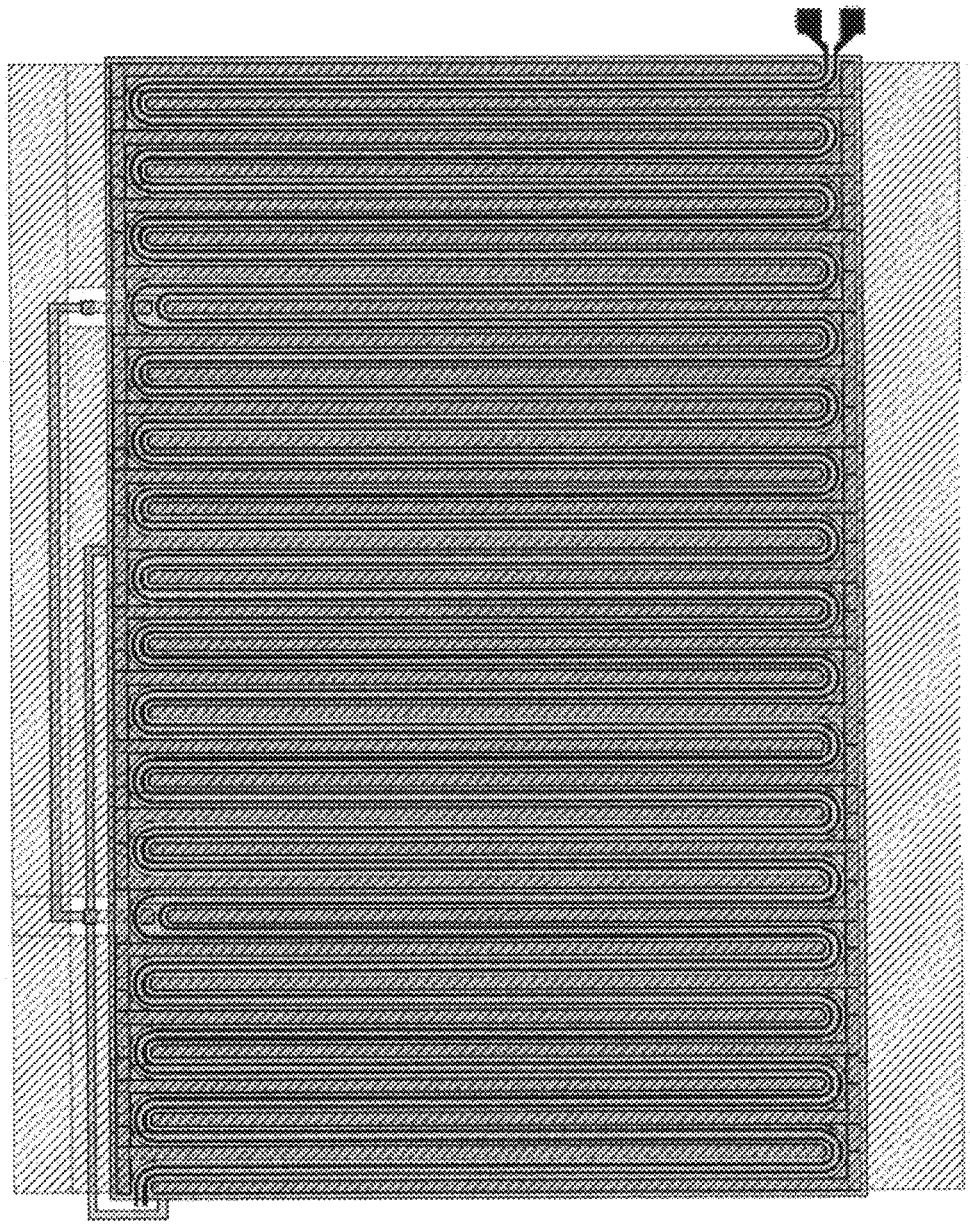
FIG. 5 illustrates the embodiment of a dual-gate FET with two contacts connected electrically to two mesa resistors.

2. Dual-gate FET with Two Contacts to the Inter-gate Region (1):

FIG. 5 illustrates the embodiment of a dual-gate FET with two contacts connected electrically to two mesa resistors. In this embodiment, a first contact connecting the inter-gate conductive region with a first mesa-type resistive component is disposed at a first turning region, being located near one third of the gate width away from one end of the gate electrodes. A second contact that also connects the inter-gate conductive region with a second mesa-type resistive component is disposed at a second turning region, being located near one third of the gate width away from the other end of the gate electrodes. In the first and the second turning regions, the two gate electrodes are intentionally disposed with a wider inter-gate spacing, which can facilitate electrical contacts between the integrate conductive region and the mesa-type resistive components. In this embodiment, the first resistive component connects the outermost drain electrode finger to the first contact, and then to the end of the source electrode. The first contact, on the other hand, further connects to the second contact by the second resistive component.

Figure 6:
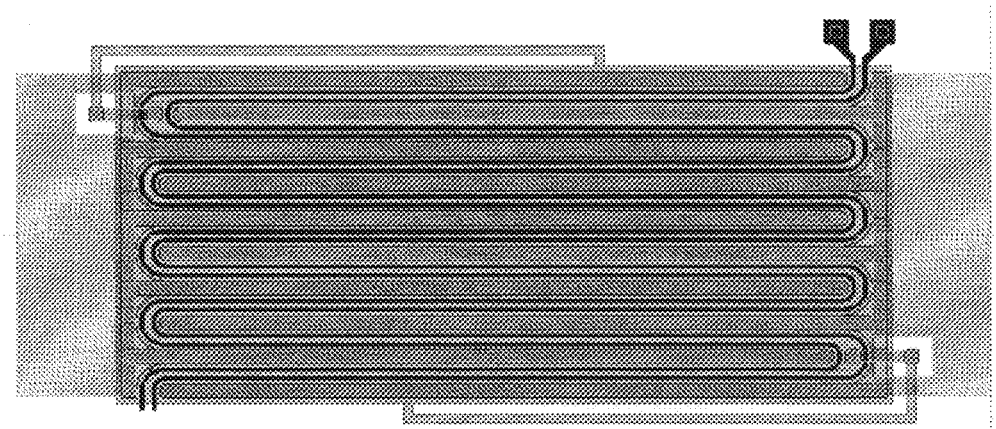
FIG. 6 illustrates another embodiment of a dual-gate FET with two contacts connected electrically to two mesa resistors.

3. Dual-gate FET with Two Contacts to the Inter-gate Region (2):

FIG. 6 illustrates another embodiment of a dual-gate FET with two contacts connected electrically to two mesa resistors. In this embodiment, a first contact connecting the inter-gate conductive region with a first mesa-type resistive component is disposed at a first turning region, being located near one end of the gate width. A second contact that also connects the inter-gate conductive region with a second mesa-type resistive component is disposed at a second turning region, being located near the other end of the gate width. In the first and the second turning regions, the two gate electrodes are intentionally disposed with a wider inter-gate spacing, which can facilitate electrical contacts between the integrate conductive region and the mesa-type resistive components. In this embodiment, the first resistive component connects the outermost drain electrode finger to the first contact, and the second resistive component connects the outermost source electrode finger to the second contact. The source and the drain is electrically connected through the first resistive component, the second resistive component and the inter-gate conductive regions connecting the first and the second resistive components. Nearly the same voltage of source, drain and the inter-gate conductive region is thereby ensured even when the FET is at OFF-state.

Figure 7:
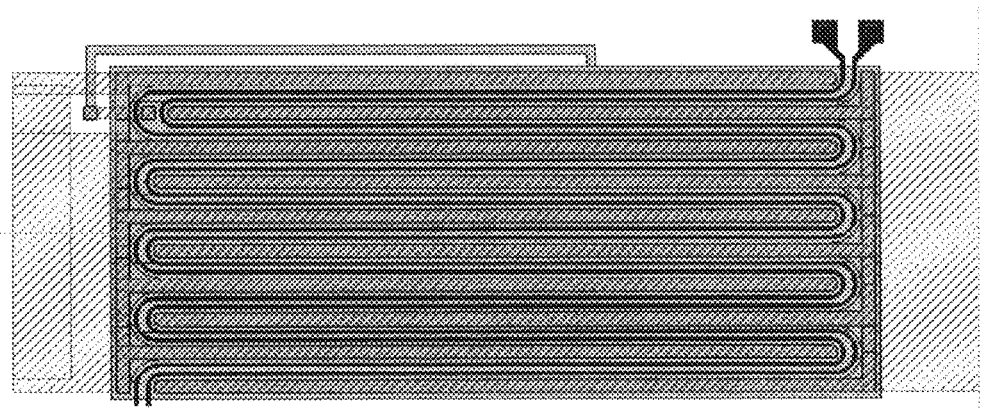
FIG. 7 illustrates the embodiment of a dual-gate FET with one contact connected electrically to one mesa resistor.

4. Dual-gate FET with One Contact to the Inter-gate Region Connected to One Balance Resistor:

FIG. 7 illustrates the embodiment of a dual-gate FET with one contact connected electrically to one balance resistors. In this embodiment, a first contact connecting the inter-gate conductive region with a first mesa-type resistive component is disposed at a first turning region, being located near one end of the gate width. In the first turning regions, the two gate electrodes are intentionally disposed with a wider inter-gate spacing, which can facilitate an electrical contact between the integrate conductive region and the mesa-type resistive component. In this embodiment, the first resistive component connects the outermost drain electrode finger to the first contact. In the layout shown in FIG. 7, there is no electrical connection through resistive components between the source electrode and the inter-gate region. One may add a resistive component between the source electrode and the drain electrode, so that nearly the same voltage is ensured for the source electrode, the drain electrode, and the inter-gate conductive region even when the PET is at OFF-state.

Figure 8:
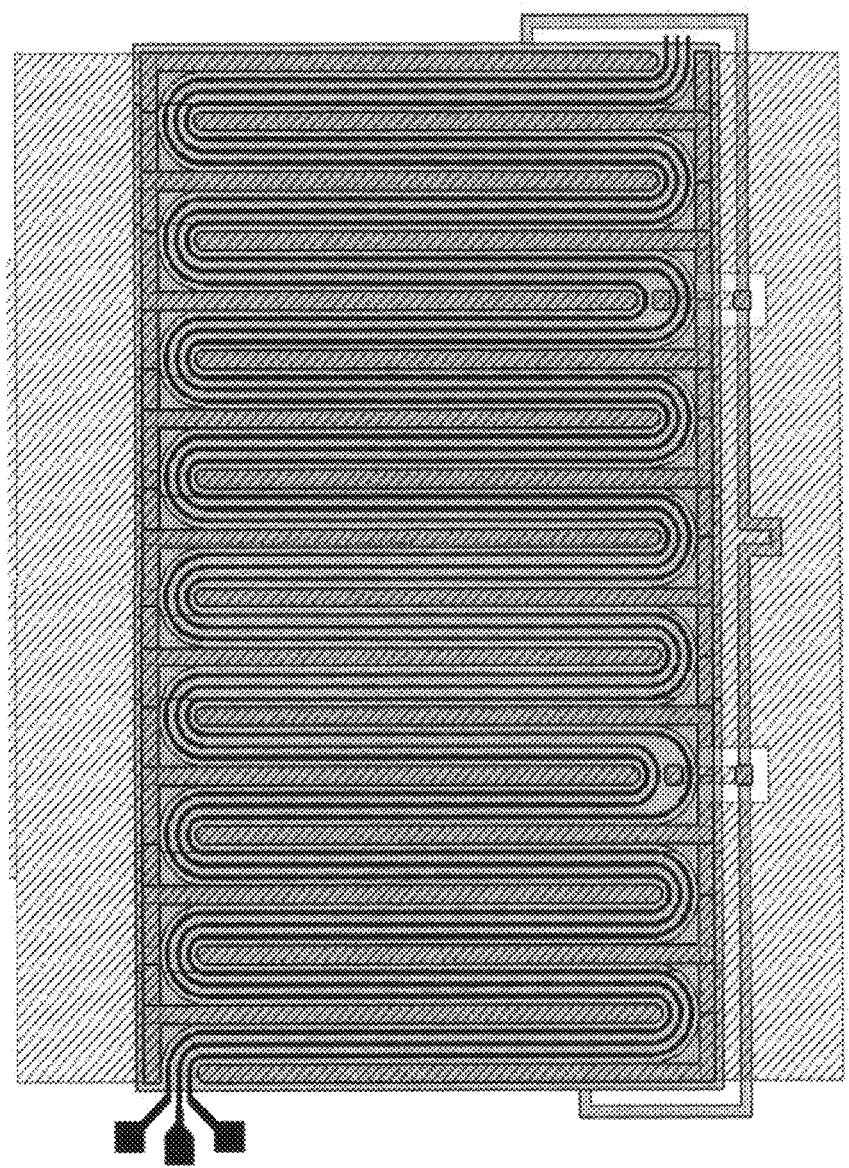
FIG. 8 illustrates the embodiment of a triple-gate FET with one contact from each inter-gate conductive region to a mesa-type resistor.

5. Triple-gate FET with One Contact to Each Inter-gate Region (1):

FIG. 8 illustrates the embodiment of a triple-gate FET with one contact from each inter-gate conductive region to a mesa-type resistor. For a triple-gate FET, there exist two inter-gate conductive regions between two adjacent gates of the three gate electrodes. Therefore, most preferably both conductive regions are connected to balance resistors. In this embodiment, a first contact, being disposed at a first turning region, connects the first inter-gate conductive region with the mesa-type resistive component. A second contact, being disposed at a second turning region, connects the second inter-gate conductive region with the mesa-type resistive component. In order to facilitate electrical contacts between each inter-gate conductive region and the mesa-type resistive component, the first inter-gate conductive region has a wider inter-gate spacing in the first turning region, while the second inter-gate conductive region has a wider inter-gate spacing in the second turning region. In this embodiment, only one mesa-type resistive component is used. The resistive component connects the outermost drain electrode finger to the first contact connecting the first inter-gate conductive region, then to the second contact connecting the second inter-gate conductive region, and finally to the outermost source electrode finger. It is worth to mention that the two turning regions are not necessarily to be located at about one third of the gate width away from the each end of the gate electrodes, as shown in FIG. 8. They can be disposed at, for example, two adjacent turning regions located near the middle of the meanderingly wrapping gates.

Figure 9:
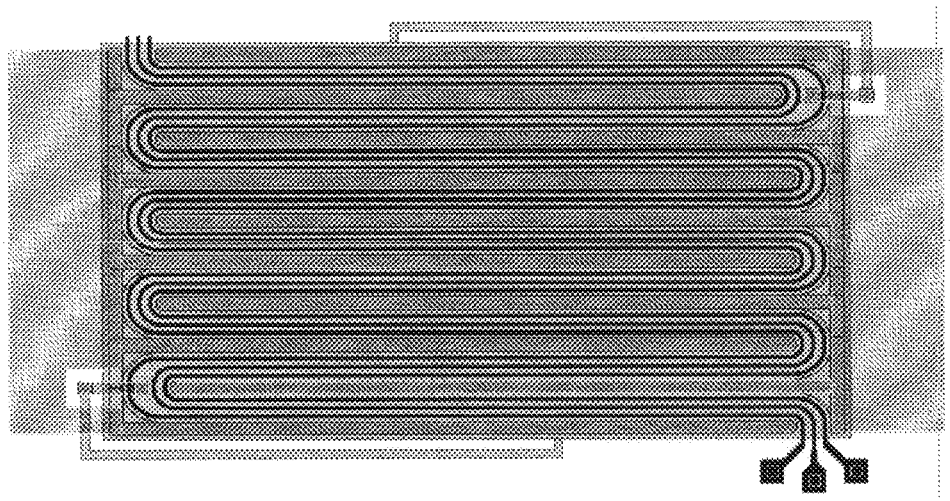
FIG. 9 illustrates another embodiment of a triple-gate FET with one contact from each inter-gate conductive region to a mesa-type resistor.

6. Triple-gate FET with One Contact to Each Inter-gate Region (2):

FIG. 9 illustrates another embodiment of a triple-gate FET with one contact from each inter-gate conductive region. In this embodiment, a first contact, being disposed at a first turning region, connects the first inter-gate conductive region with the first resistive component. A second contact, being disposed at a second turning region, connects the second inter-gate conductive region with the second resistive component. In order to facilitate electrical contacts between each inter-gate conductive region and the mesa-type resistive component, the first inter-gate conductive region has a wider inter-gate spacing in the first turning region, while the second inter-gate conductive region has a wider inter-gate spacing in the second turning region. In this embodiment, two mesa-type resistive components are used. The first resistive component connects the outermost drain electrode finger to the first contact connecting the first inter-gate conductive region, and the second resistive component connects the outermost source electrode finger to the second contact connecting the second inter-gate conductive region. In FIG. 9, there is no resistive component connecting the first inter-gate conductive regions and the second inter-gate conductive region. One may add a resistive component between the source electrode and the drain electrode, so that nearly the same voltage is ensured for the source electrode, the drain electrode, first inter-gate conductive region and the second inter-gate conductive region even when the FET is at OFF-state.

Figure 10:
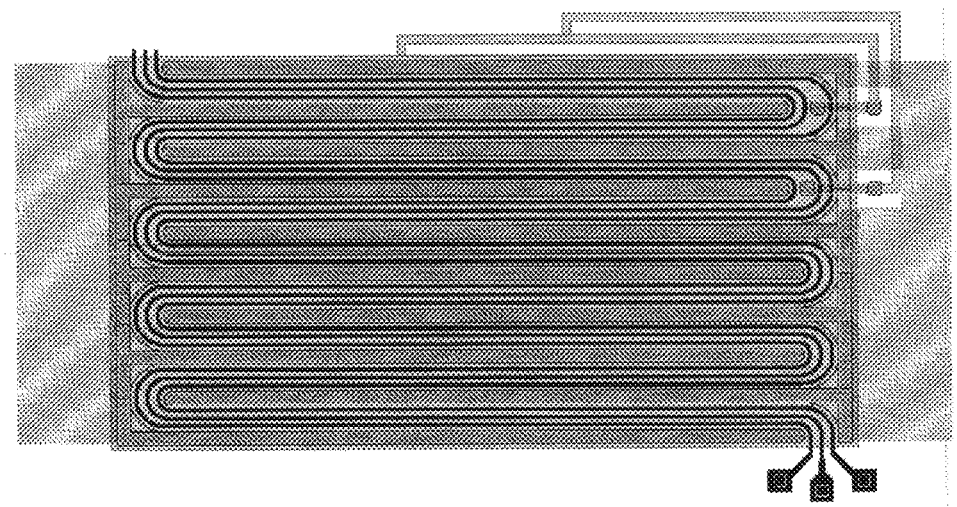
FIG. 10 illustrates another embodiment of a triple-gate FET with one contact from each inter-gate conductive region to a mesa-type resistor.

7. Triple-gate FET with One Contact to Each Inter-gate Region (3):

FIG. 10 illustrates another embodiment of a triple-gate FET with one contact from each inter-gate conductive region. In this embodiment, a first contact, being disposed at a first turning region, connects the first inter-gate conductive region with the first resistive component. A second contact, being disposed at a second turning region, connects the second inter-gate conductive region with the second resistive component. In order to facilitate electrical contacts between each inter-gate conductive region and the mesa-type resistive component, the first inter-gate conductive region has a wider inter-gate spacing in the first turning region, while the second inter-gate conductive region has a wider inter-gate spacing in the second turning region. In this embodiment, two mesa-type resistive components are used. The first resistive component connects the outermost drain electrode finger to the first contact connecting the first inter-gate conductive region, and the second resistive component connects a position between the two ends of the first resistive component to the second contact connecting the second inter-gate conductive region. The second inter-gate conductive region is electrically connected to the outermost drain electrode finger through the second resistive component and part of the first resistive component. Alternatively, the second resistive component can be connected directly to the outermost drain electrode finger. In FIG. 10, there is no resistive component connecting the second inter-gate conductive region and the source electrode. One may add a resistive component between the source electrode and the drain electrode, so that nearly the same voltage is ensured for the source electrode, the drain electrode, first inter-gate conductive region and the second inter-gate conductive region even when the FET is at OFF-state.

Figure 11:
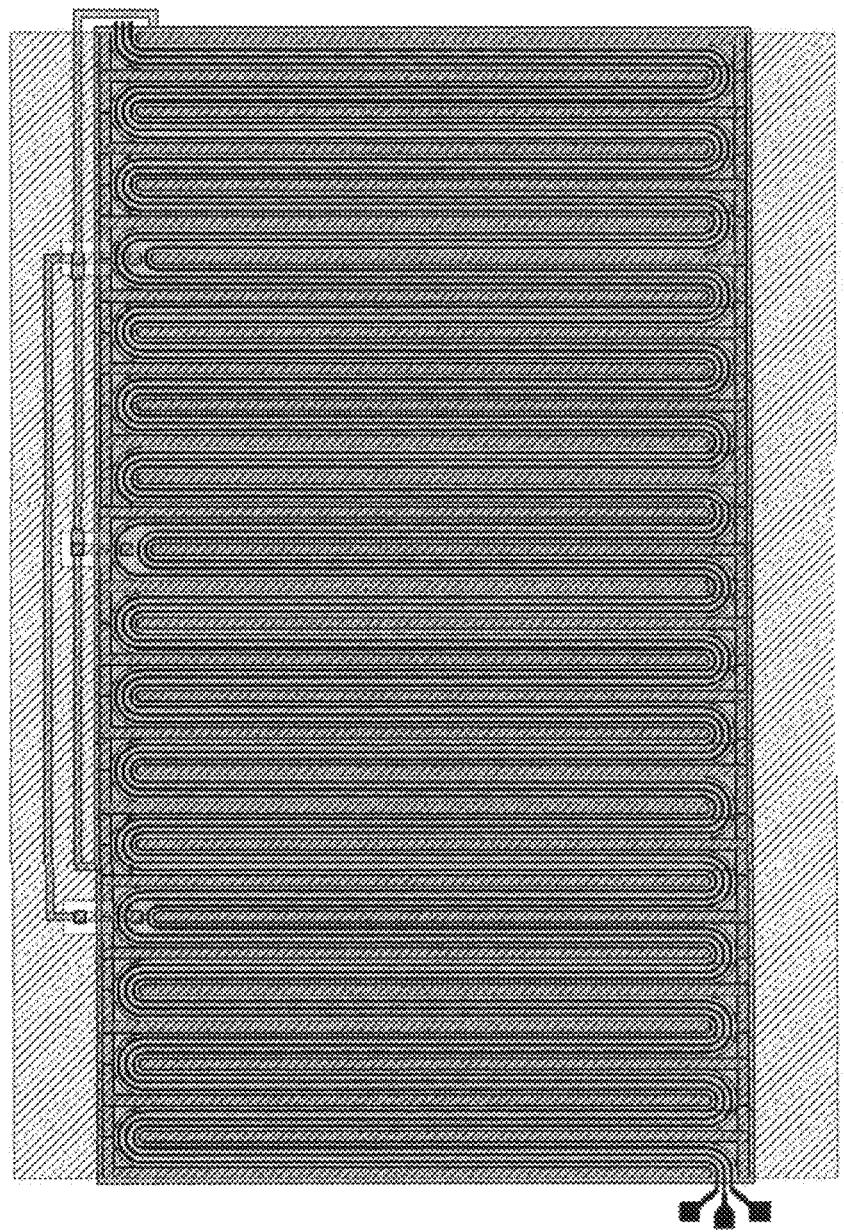
FIG. 11 illustrates the embodiment of a triple-gate FET with two contacts from one of the two inter-gate conductive regions to a mesa-type resistor, and one contact to the other inter-gate conductive region to another mesa-type resistor.

8. Triple-gate FET with Two Contacts to One of the Two Inter-gate Region:

FIG. 11 illustrates the embodiment of a triple-gate FET with two contacts from one of the two inter-gate conductive regions to a mesa-type resistor, and one contact to the other inter-gate conductive region to another mesa-type resistor. In this embodiment, a first contact and a second contact, being disposed in the first inter-gate region, but separately at the first turning region and the second turning region, respective, are connected from one another by the first mesa-type resistive component. A third contact, being disposed at a third turning region, connects the second inter-gate conductive region with the second mesa-type resistive component. To facilitate electrical connections from each contact to resistive components, the first inter-gate conductive region has a wider inter-gate spacing in the first and the second turning region, while the second inter-gate conductive region has a wider inter-gate spacing in the third turning region. The second resistive component further connects from the outermost drain electrode finger to the first contact connecting the first inter-gate conductive region at the first contact, then to the third contact connecting the second inter-gate conductive region in the third turning region, and finally to the end of the source electrode.

Figure 12:
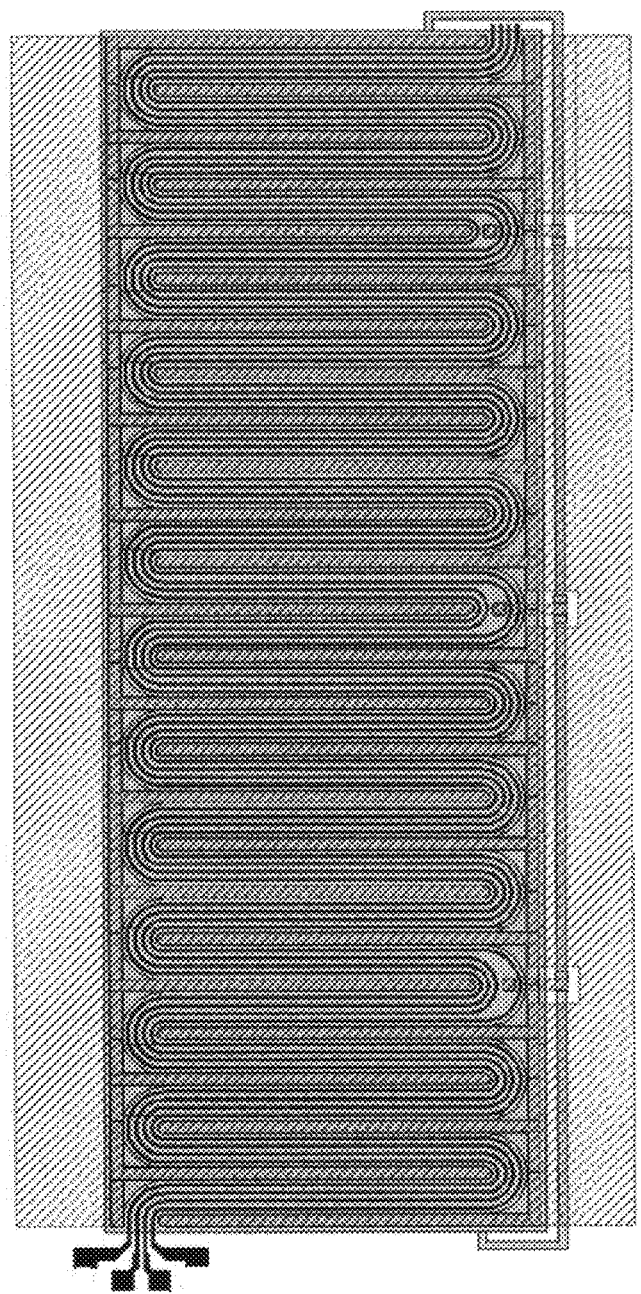
FIG. 12 illustrates the embodiment of a quadruple-gate FET with one contact from each inter-gate conductive region to a mesa-type resistor.

9. Quadruple-gate with One Contact to Each Inter-gate Region (1):

FIG. 12 illustrates the embodiment of a quadruple-gate FET with one contact from each inter-gate conductive region to a mesa-type resistor. In the quadruple-gate FET, there have three inter-gate conductive regions between two adjacent gates of the four gate electrodes. In this embodiment, a first contact, a second contact and a third contact are disposed separately in the first inter-gate conductive region at the first turning region, in the second inter-gate conductive region at the second turning region and in the third inter-gate conductive region at the third turning region, respectively. In each turning region, the respective inter-gate conductive region has a wider inter-gate spacing, such that electrical contact can be made easily in each turning region to the resistive component. The resistive component further connects from the outermost drain electrode finger to the first contact connecting the first inter-gate conductive region at the first contact, then to the second and the third contact connecting the second and the third inter-gate conductive regions in the second and the third turning regions, respectively, and finally to the outermost source electrode fingers.

Figure 13:
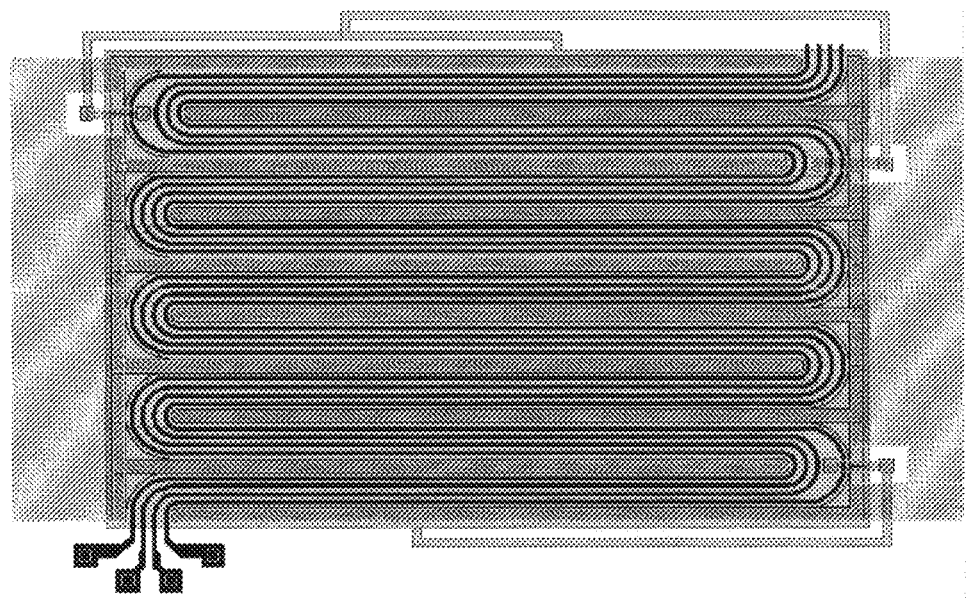
FIG. 13 illustrates another embodiment of a quadruple-gate FET with one contact from each inter-gate conductive region to a mesa-type resistor.

10. Quadruple-gate with One Contact to Each Inter-gate Region (2):

FIG. 13 illustrates another embodiment of a quadruple-gate FET with one contact from each inter-gate conductive region to a mesa-type resistor. In this embodiment, a first contact, a second contact and a third contact are disposed separately in the first inter-gate conductive region at the first turning region, in the second inter-gate conductive region at the second turning region and in the third inter-gate conductive region at the third turning region, respectively. In each turning region, the respective inter-gate conductive region has a wider inter-gate spacing, such that electrical contact can be made easily in each turning region to the resistive component. The first resistive component connects from the outermost drain electrode finger to the first inter-gate conductive region at the first contact. The second resistive component connects from the point between two ends of the first resistive component to the second inter-gate conductive region at the second contact. The second inter-gate conductive region is electrically connected to the outermost drain electrode finger through the second resistive component and part of the first resistive component. Alternatively, the second resistive component can be connected directly to the outermost drain electrode finger. The third resistive component connects from the outermost source electrode finger to the third inter-gate conductive region at the third contact. In FIG. 13, there is no resistive component connecting the second inter-gate conductive region and the third inter-gate conductive region. One may add a resistive component between the source electrode and the drain electrode, so that nearly the same voltage is ensured for the source electrode, the drain electrode, the first inter-gate conductive region, the second inter-gate conductive region and the third inter-gate conductive region even when the FET is at OFF-state.

Figure 14:
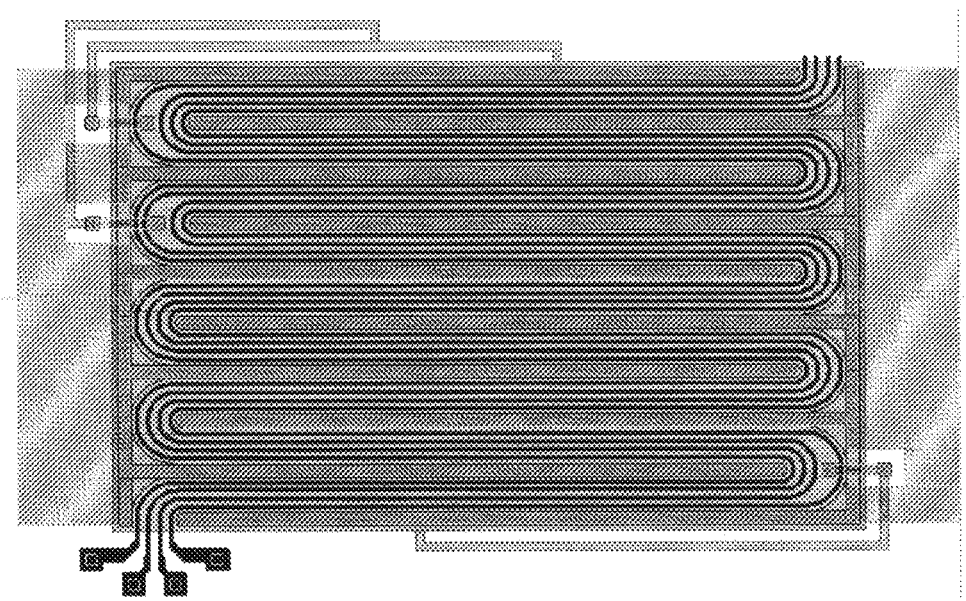
FIG. 14 illustrates another embodiment of a quadruple-gate FET with one contact from each inter-gate conductive region to a mesa-type resistor.

11. Quadruple-gate with One Contact to Each Inter-gate Region (3):

FIG. 14 illustrates another embodiment of a quadruple-gate FET with one contact from each inter-gate conductive region to a mesa-type resistor. In this embodiment, a first contact, a second contact and a third contact are disposed separately in the first inter-gate conductive region at the first turning region, in the second inter-gate conductive region at the second turning region and in the third inter-gate conductive region at the third turning region, respectively. In each turning region, the respective inter-gate conductive region has a wider inter-gate spacing, such that electrical contact can be made easily in each turning region to the resistive component. The first resistive component connects from the outermost drain electrode finger to the first inter-gate conductive region at the first contact. The second resistive component connects from the point between two ends of the first resistive component to the second inter-gate conductive region at the second contact. The second inter-gate conductive region is electrically connected to the outermost drain electrode finger through the second resistive component and part of the first resistive component. Alternatively, the second resistive component can be connected directly to the outermost drain electrode finger. The difference from the previous embodiment shown in FIG. 13 is that the first contact and the second contact are made at turning regions on the same side. The third resistive component connects from the outermost source electrode finger to the third inter-gate conductive region at the third contact. In FIG. 14, there is no resistive component connecting the second inter-gate conductive region and the third inter-gate conductive region. One may add a resistive component between the source electrode and the drain electrode, so that nearly the same voltage is ensured for the source electrode, the drain electrode, the first inter-gate conductive region, the second inter-gate conductive region and the third inter-gate conductive region even when the FET is at OFF-state.

Figure 15A:
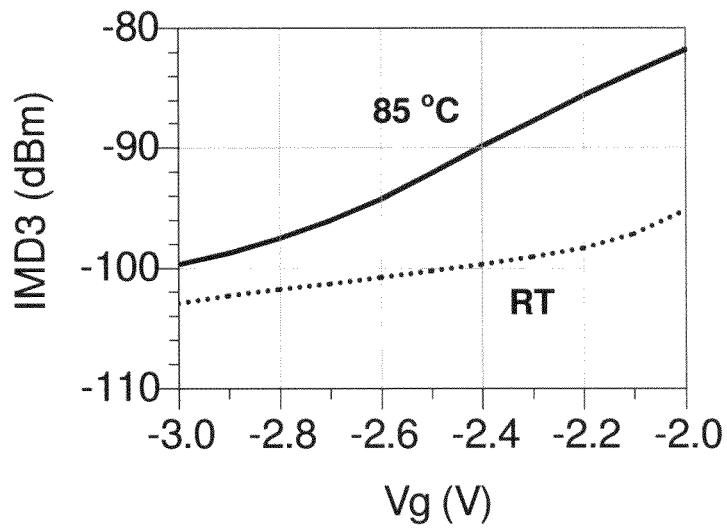
FIGS. 15A and 15B compare the IMD as function of the gate voltage Vg of two triple-gate HEMT devices according to the designs of prior arts and of the present invention, respectively.
Figure 15B:
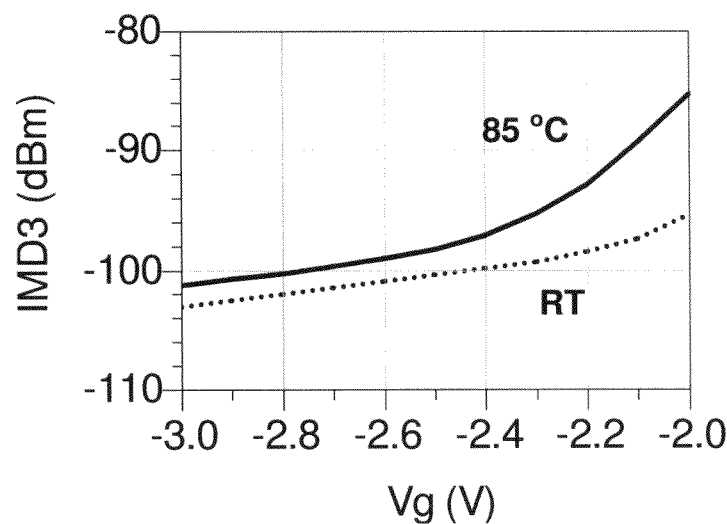
Figure 16A:
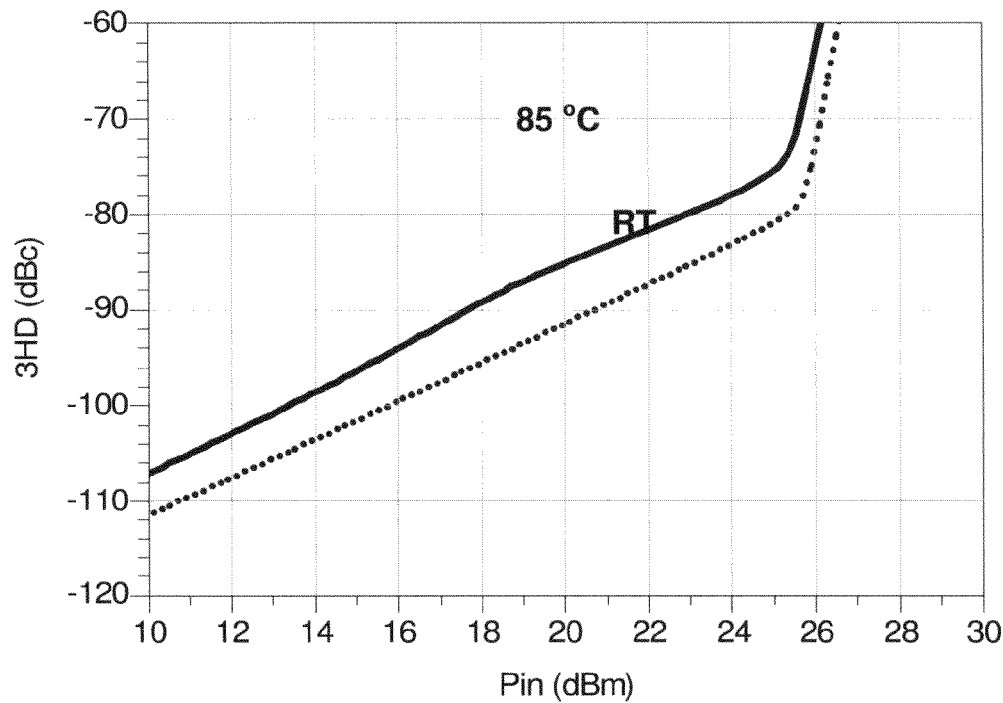
FIGS. 16A and 16B show the HD as function of the input RF power (Pin) of the triple-gate HEMT devices according to the design of prior arts and of the present invention, respectively.
Figure 16B:
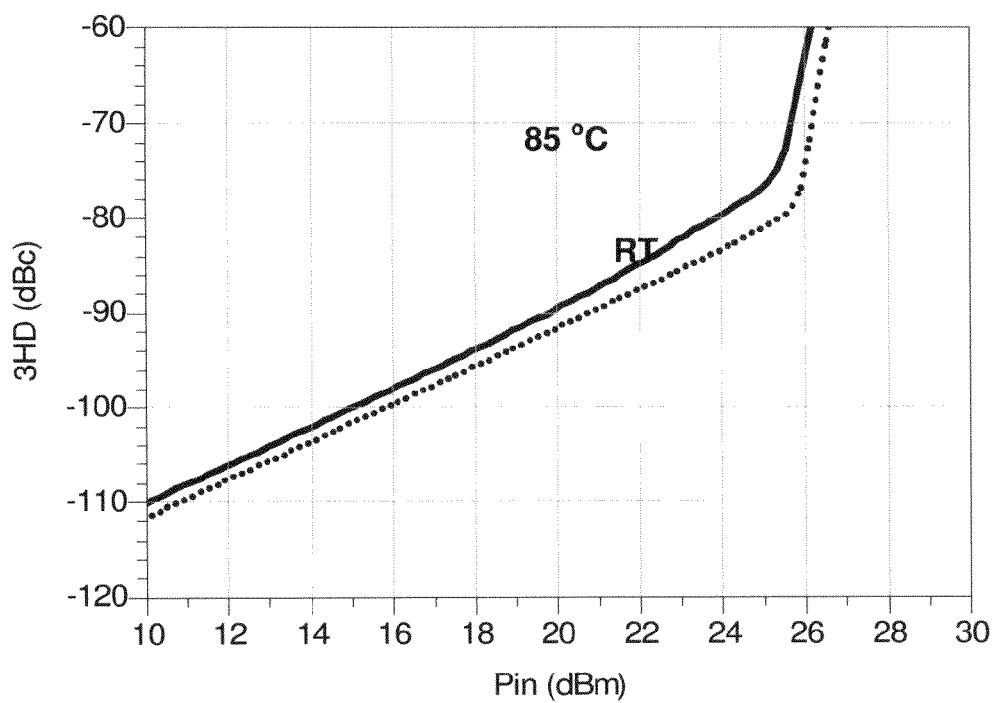

The performances of the multi-gate FET devices using the design of the present invention have also been examined thoroughly. It was found that connecting the balance resistor at the half way of meandering gates can indeed achieve a lower inter modulation distortion (IMD) and a lower harmonic distortion (HD), as compared with that connecting at one end of the gate electrodes. FIGS. 15A and 15B compare the IMD as function of the gate voltage Vg of two triple-gate HEMT devices with a gate width of 4 mm according to the designs of prior arts and of the present invention, respectively. It is clear that a low IMD can be obtained in a wide operation temperature range. A 6 dB improvement can be achieved at 85° C. when the device was operating at Vg=2.5 V. On the other hand, the HD of the triple-gate HEMT can also be improved considerably using the design of the present invention. FIGS. 16A and 16B show the HD as function of the input RF power (Pin) of the triple-gate HEMT devices with a gate width of 4 mm according to the design of prior arts and of the present invention, respectively. A lower HD is obtained at 85° C. for the device with a balance resistor connecting the half way of meandering gate. This indicates that the present invention can achieve a low HD in a wide operation temperature range.

In the preferred embodiments presented above, the gate electrodes are wrapping around the source and drain fingers, so that the turned regions of meandering gate also contribute to the device performance nearly equally to the other portion of the devices. However, the present invention is not limited to such cases. As long as the inter-gate conductive regions is formed along the gate including turned regions, the contact to balance resistor can be made at that turned region to form the electrical contact between the balance resistor and the inter-gate conductive region.

As discussed above, the present invention disclosing a design of multi-gate FET devices for the applications in switch elements has the following advantages:

1. Reducing the voltage drop along the conductive region with a minimal change in device layout;
2. Improving the off-state linearity while retaining a low insertion loss;
3. Minimizing the area occupied by the balance resistor and hence the total chip size.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A multi-gate semiconductor device, comprising:
   a substrate;
   a multilayer structure formed upon the substrate;
   a first ohmic electrode formed by a plural of electrode fingers upon the multilayer structure;
   a second ohmic electrode formed by a plural of electrode fingers upon the multilayer structure and being disposed adjacent to the first ohmic electrode fingers;
   a channel layer formed in the multilayer structure between the first and the second ohmic electrodes;

a plural of gate electrodes being meanderingly disposed between the first and the second ohmic electrode fingers;

at least one conductive region formed between two adjacent gate electrodes among the plural of gate electrodes; and at least one resistive component, wherein the multilayer structure, the channel layer, the first ohmic electrode fingers, the second ohmic electrode fingers, and the gate electrodes form a field-effect transistor, wherein the at least one conductive region interposed between the adjacent gate electrodes has at least one portion with a wider inter gate spacing at the turning region of the meanderingly disposed gate electrodes that provides a contact to which the resistive component is electrically connected, and wherein the electrical connection between the resistive component and the conductive region is made at a position between two ends, excluding at the very end, of each gate electrode, with a connecting means extending out from the contact position on the conductive region across the gate electrode.

2. The multi-gate semiconductor device according to claim 1, wherein said field effect transistor is a high-electron-mobility transistor.

3. The multi-gate semiconductor device according to claim 2, wherein said high-electron-mobility transistor is a pseudomorphic high-electron-mobility transistor.

4. The multi-gate semiconductor device according to claim 1, wherein said field-effect transistor is a gallium nitride field effect transistor.

5. The multi-gate semiconductor device according to claim 1, wherein said multi-gate semiconductor device forms a switching device.

6. The multi-gate semiconductor device according to claim 1, wherein said resistive component is made of the semiconductor multilayer structure, and at least a part of the resistive component is placed under a metal layer that feeds radio frequency signals into the channel layer through the ohmic electrode fingers.

* * * * *